(12) United States Patent  
Voshell

(10) Patent No.: US 7,082,569 B2  
(45) Date of Patent: Jul. 25, 2006

(54) SYSTEMS AND METHODS PROVIDING DYNAMIC SPREADSHEET FUNCTIONALITY

(75) Inventor: Perlie E. Voshell, Huntington, CT (US)

(73) Assignee: OutlookSoft Corporation, Stamford, CT (US)

( * ) Notice: Subject to any disclaimer, the term of this patent is extended or adjusted under 35 U.S.C. 154(b) by 411 days.

(21) Appl. No.: 10/043,675

(22) Filed: Jan. 11, 2002

(65) Prior Publication Data

US 2002/0169799 A1 Nov. 14, 2002

Related U.S. Application Data

(60) Provisional application No. 60/262,204, filed on Jan. 17, 2001.

(51) Int. Cl.  
*G06F 15/00* (2006.01)

(52) U.S. Cl. .................. 715/503; 715/504; 715/505; 715/506; 715/507; 715/508

(58) Field of Classification Search ........ 715/503–508, 715/531; 345/803  
See application file for complete search history.

(56) References Cited

U.S. PATENT DOCUMENTS

| | | | |
|---|---|---|---|
| 4,989,141 A | 1/1991 | Lyons et al. | |
| 5,165,012 A | 11/1992 | Crandall et al. | |
| 5,189,608 A | 2/1993 | Lyons et al. | |
| 5,233,513 A | 8/1993 | Doyle | |
| 5,247,611 A * | 9/1993 | Norden-Paul et al. | 715/504 |
| 5,303,146 A * | 4/1994 | Ammirato et al. | 715/503 |
| 5,321,803 A * | 6/1994 | Ditter, Jr. | 345/703 |
| 5,359,724 A | 10/1994 | Earle | |
| 5,371,675 A | 12/1994 | Greif et al. | |
| 5,381,332 A | 1/1995 | Wood | |
| 5,390,296 A | 2/1995 | Crandall et al. | |
| 5,444,842 A * | 8/1995 | Bentson et al. | 345/854 |
| 5,682,526 A * | 10/1997 | Smokoff et al. | 707/104.1 |
| 5,701,499 A * | 12/1997 | Capson et al. | 715/503 |
| 5,727,161 A | 3/1998 | Purcell et al. | |
| 5,799,286 A | 8/1998 | Morgan et al. | |

(Continued)

FOREIGN PATENT DOCUMENTS

EP 0997834 5/2000

OTHER PUBLICATIONS

PCT International Search Report dated Jun. 4, 2002.

(Continued)

*Primary Examiner*—Stephen Hong  
*Assistant Examiner*—David Faber  
(74) *Attorney, Agent, or Firm*—Wilmer Cutler Pickering Hale and Dorr LLP

(57) ABSTRACT

An advantageous system and method are provided for supporting and/or enabling the creation of dynamic reports and/or data presentation(s) in connection with a spreadsheet-based application or program. The disclosed system and method offer a full complement of spreadsheet-based formatting and calculation capabilities. In addition, the system and method of the present disclosure may be used in conjunction with and/or incorporated as part of spreadsheet-based application(s) and/or program(s) found on stand-alone clients and/or networked clients. The disclosed system and method generally include an electronic spreadsheet having a plurality of cells that are arrayed in a defined number of columns and rows, a database in communication with the electronic spreadsheet, and an expansion formula that functions to control retrieval of data from the database and automatically varies/expands at least one of the defined number of columns and rows to accommodate the data retrieval.

24 Claims, 7 Drawing Sheets

U.S. PATENT DOCUMENTS

| | | | |
|---|---|---|---|
| 5,883,623 | A | 3/1999 | Cseri |
| 5,893,124 | A * | 4/1999 | Ogaki et al. ............. 715/507 |
| 5,933,830 | A | 8/1999 | Williams |
| 5,991,741 | A | 11/1999 | Speakman et al. |
| 6,026,459 | A | 2/2000 | Huppenthal |
| 6,055,548 | A | 4/2000 | Comer et al. |
| 6,073,107 | A | 6/2000 | Minkiewicz et al. |
| 6,076,152 | A | 6/2000 | Huppenthal et al. |
| 6,115,690 | A | 9/2000 | Wong |
| 6,128,602 | A | 10/2000 | Northington et al. |
| 6,317,750 | B1 * | 11/2001 | Tortolani et al. ....... 707/103 R |

OTHER PUBLICATIONS http://www.srcsoftware.com/inet_bud.htm, I*Net Budgeting—The Web Enabled Budgeting Solution from SRC, 2000.

Hyperion Essbase Release 6, Spreadsheet Add-in User's Guide for Excel, Internet Article: Hyperion Essbase. Hyperion Solutions Corporation, 'Online! 2000, XP002224232 Sunnyvale, CA Retrieved from the Internet: <URL:http://www.essbase.com/techdocs/essbase/essbase_60/Docs/PDF/essexcel.pdf> 'retreived on Dec. 09, 2002! part of Chapter 2: A Basic Hyperion Essbase Tutorial part of Chapter 3: An Advanced Hyperion Essbase Tutorial, pp. 2-49-pp. 2-91; pp. 3-9-pp. 3-57.

Applix TM1 Perspectives, Internet Article. Applix, Inc., 'Online! Mar. 1999, XP002224231 Retrieved from the Internet; <URL:http://www.klesse.de/res/pdf_tm1perspectives.pdf> 'retrieved on Dec. 9, 2002! Kapitel 4: Arbeitsblatter für Datenanalyseverwenden, p. 4-1-p. 4-36.

Getting Started With OLAP@Work for Microsoft Excel, Internet Article: OLAP@Work Inc., 'Online! 1999, XP002224233 Retrieved from the Internet: <URL:http://www.groovemarketing.ca/pdf/Simp_GS.PDF> 'retrieved on Dec. 9, 2002!.

Shiena, M., OutlookSoft's Everest TM: A Collaborative Portal For Enterprise Budgeting, Internet Article: The Aberdeen Group Impact Report, 'Online! Aug. 5, 2000, XP002224236 Retrieved From the Internet:: <URL:http://web.archive.org/web/20021209072834/http://www.outlooksoft.com/whitepapers/OS_aberdeen.pdf>, 'retrieved on Dec. 9, 2002!.

Pendse, N., OLP Omnipresent, BYTE, 'Online! Feb. 1998, XP002224235, Retrieved from the Internet: <URL:http://www.byte.com/art/9802/sec6/art7.htm> 'retrieved on Dec. 6, 2002!.

European Search Report dated Jan. 2, 2003.

* cited by examiner

SYSTEMS AND METHODS PROVIDING DYNAMIC SPREADSHEET FUNCTIONALITY

CROSS-REFERENCE TO RELATED APPLICATIONS

The subject application claims the benefit of co-pending, commonly assigned, U.S. Provisional Patent Application Ser. No. 60/262,204, filed Jan. 17, 2001, entitled "Dynamic Spread Sheet," the entire contents of which is hereby incorporated by reference.

BACKGROUND

1. Technical Field

The present disclosure relates to a system and method for supporting and/or enabling the creation of dynamic reports and/or data presentation(s) in connection with a spreadsheet application or program that offers spreadsheet-based formatting and calculation capabilities. The system and method of the present disclosure may be used in conjunction with and/or incorporated as part of spreadsheet program(s) found on stand-alone clients and/or networked clients.

2. Background of the Disclosure

The use of spreadsheets to collect, assess, monitor and manage information and data is pervasive. Conventional company reports utilizing spreadsheets take a host of forms and typically require or utilize a variable number of columns and rows to capture, reflect and facilitate manipulation of the desired data/information. For a given spreadsheet-based report, the columns and rows may vary based upon any number of variables, e.g., organizational components and/or characteristics of a company, such as which departments report to which other departments, how the functional areas of a company are divided/deployed, etc. In typical spreadsheet-based reports, the contents of such reports must be defined as static columns and rows if the report is to include full spreadsheet formatting and calculation capabilities. Alternatively, the columns and rows may be dynamically defined; however, in enabling dynamic definitions of columns/rows, the detailed cell-by-cell formatting and calculation control are not available.

The assignee of the present application, OutlookSoft Corporation (Stamford, Conn.), has developed and deployed a preferred method and system for facilitating information exchange between individuals and entities interacting on a shared project, e.g., horizontal (i.e., non-hierarchical) participation in and/or contribution to a spreadsheet based project. OutlookSoft's Enterprise Analytic Portal™ or EAP™ product is a web-based, collaborative solution that unifies the business planning and performance management processes, empowering every manager—at all corporate levels—to drive personalized performance in support of organizational objectives. The EAP™ product delivers a single, centrally managed solution that optimizes business processes enterprise-wide and fosters a collaborative, proactive, and efficient business environment. Key process areas addressed by the EAP™ product include budgeting and planning, consolidation, multi-dimensional analysis, reporting and performance management.

In the field of spreadsheet-based systems and reporting, there is a need for a system and method that would allow a spreadsheet user to define and/or interact with a report that includes dynamically defined rows and columns. The dynamically defined rows and columns would optimally be provided with and/or include functionality that would facilitate automatic variability based on relevant parameter(s) and/or criteria, e.g., changing organizational components and/or characteristics of a company, and would also allow detailed spreadsheet formatting and calculation control of report(s) and/or displays provided thereby.

SUMMARY OF THE DISCLOSURE

According to the present disclosure, an advantageous system and method are provided for supporting and/or enabling the creation of dynamic reports and/or data presentation(s) in connection with a spreadsheet-based application or program. The disclosed system and method offer a full complement of spreadsheet-based formatting and calculation capabilities. In addition, the system and method of the present disclosure may be used in conjunction with and/or incorporated as part of spreadsheet-based application(s) and/or program(s) found on stand-alone clients and/or networked clients. In a preferred embodiment of the present disclosure, the disclosed system and method are advantageously incorporated into a web-based, collaborative spreadsheet-based solution, such as the EAP™ product that is commercially available from OutlookSoft Corporation (Stamford, Conn.).

According to preferred embodiments of the present disclosure, a system and method for dynamic spreadsheet reporting is provided that provides and/or supports the following functions:

- providing an electronic spreadsheet having a plurality of cells that are arrayed in a defined number of columns and rows;
- providing a database in communication with the electronic spreadsheet;
- defining an expansion formula in at least one of the plurality of cells, the expansion formula functioning to control retrieval of data from the database and to automatically vary at least one of the defined number of columns and rows to accommodate the data retrieval.

In preferred embodiments of the disclosed systems and methods, the electronic spreadsheet is supported by a spreadsheet application that provides formatting and calculation functionalities to the electronic spreadsheet. The spreadsheet application generally resides on a computer system, e.g., a stand-alone client and a networked client. A particularly preferred spreadsheet application is a collaborative spreadsheet application that operates across a plurality of networked computers, e.g., the EAP™ product that is commercially available from the current assignee.

The data typically includes at least one dimension member, and such dimension member is generally identified by at least one parameter set forth in the expansion formula. Dimension members may reflect virtually any type or nature of data category, e.g., time periods, departments, account types, account categories, product types, product categories and combinations thereof.

Exemplary systems and methods according to the present disclosure further include functionalities for:

- automatically updating the electronic spreadsheet to include a new dimension member upon introduction of the new dimension member to the database, provided the definition of the expansion formula calls for retrieval of the new dimension member from the database;
- automatically varying at least one of the defined number of columns and rows, as necessary, and in so doing, not impairing the operability or functionality of the electronic spreadsheet external to such data retrieval accommodation;

defining member list(s) in the database, the member list(s) including hierarchical list(s) of members within a given data category.

Preferred embodiments of the disclosed systems and methods generally provide one or more expansion formula (e) that utilize an EVEXP function, EVNXP function, an EvENE function, an EvLST function, an EvSET function, an EvPXR function, and/or combinations thereof. Exemplary embodiments also advantageously provide nested functions within such expansion formula(e).

The disclosed systems and methods are advantageously adapted to recalculate the electronic spreadsheet based on data retrieved from the database, as controlled by the expansion formula;

build a cache in a memory for the expansion formula;

expand the electronic spreadsheet by querying the database for a list of members as defined in expansion parameters included in the expansion formula;

adjust the number of cells in a key range and a data range associated with the expansion formula as necessary to accommodate the list of members;

populate the key range with members from the list of members;

copy formulas from at least one of the plurality of cells to an appropriate newly inserted cell to fill an entire data range;

delete the cache in the memory; and/or recalculate the electronic spreadsheet in the expanded electronic spreadsheet.

Additional features, functions and benefits associated with the disclosed system and method will become apparent from the detailed description which follows, and the claims appended hereto.

BRIEF DESCRIPTION OF THE DRAWINGS

So that those having ordinary skill in the art to which the disclosed system and method pertains will more readily understand how to employ and use the same, reference may be made to the drawings wherein:

FIG. 3 is an exemplary screen display, similar to FIG. 2, illustrating the use of an EVEXP formula for dynamically varying, e.g., expanding, the rows of a report or display;

FIG. 7 is an exemplary screen display, similar to FIG. 6, illustrating the use of EVNXP formulas for dynamically varying, e.g., expanding, the rows of a report or display for two members.

DETAILED DESCRIPTION OF PREFERRED EMBODIMENT(S)

Figure 1:
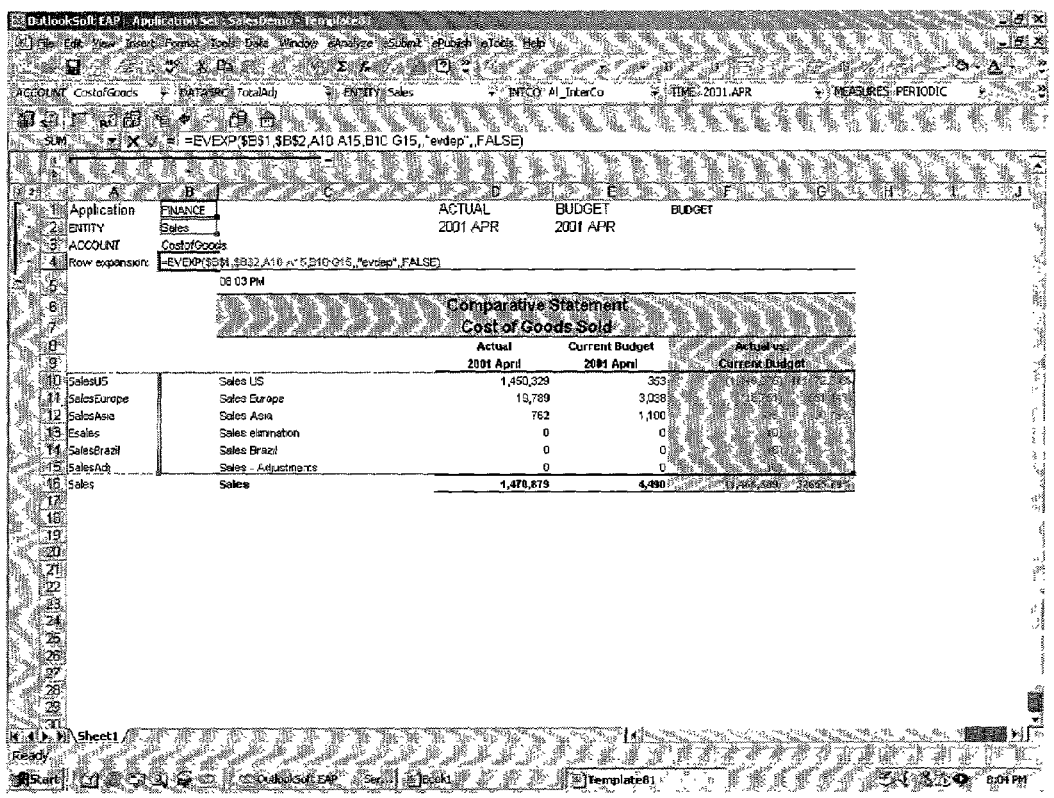
FIG. 1 is an exemplary screen display illustrating the use of an EVEXP formula for dynamically varying, e.g., expanding, the rows of a report or display.

The present disclosure provides an advantageous system and method for supporting and/or enabling the creation of dynamic reports and/or data presentation(s) in connection with a spreadsheet-based application or program. The disclosed system and method offer a full complement of spreadsheet-based formatting and calculation capabilities. In addition, the system and method of the present disclosure may be used in conjunction with and/or incorporated as part of spreadsheet-based application(s) and/or program(s) found on stand-alone clients and/or networked clients.

In a preferred embodiment of the present disclosure, the system and method are incorporated into a web-based, collaborative spreadsheet-based solution, such as the EAP™ product available from OutlookSoft Corporation (Stamford, Conn.). Additional examples of networked client systems wherein the system and method of the present disclosure may be advantageously employed and/or utilized are set forth in commonly assigned U.S. patent application Ser. No. 09/580,676, entitled "Method and System for Facilitating Information Exchange," and U.S. patent application Ser. No. 09/580,842, entitled "Method and System for Facilitating Networked Information Exchange." The entire contents of the foregoing commonly assigned patent applications are hereby incorporated by reference.

Generally, it has been found according to the disclosed system and method that the creation of dynamic reports and/or data presentation(s) in connection with a spreadsheet-based application or program (generally referred to herein as "dynamic spreadsheet reporting") may be supported, enabled and/or implemented by adding an innovative formula to at least one cell within a spreadsheet associated with such spreadsheet-based application or program. In a preferred embodiment, a "one-line" formula may be utilized to prompt the required interaction(s) with the associated database containing relevant data/information and thereby achieve the desired dynamic spreadsheet reporting functionality.

An advantageous "macro" is disclosed herein which, when executed, automatically retrieves "dimension members"—which are identified in the formula—from a database associated with the spreadsheet program/application, based on parameters specified in the formula. As used herein, the term "dimension member" refers to any applicable categorization or grouping of data or information, e.g., time periods (such as the months of January, February, etc.), departments (such as sales, human resources, finance, etc.), account types or groupings (such as revenue, cost, commission, etc.), product types or categories (such as toys, automobiles, convertibles, etc. or, within the toy category, sub-categories such as dolls, board games, video games, etc.), or the like.

Once the appropriate dimension members are retrieved, the disclosed macro expands/contracts an appropriate discrete region of the spreadsheet to include the retrieved dimension members, while maintaining the overall report structure, operation and functionality of the spreadsheet. In other words, the expansion/contraction of a discrete portion of the spreadsheet based on the operation of the disclosed macro does not impair or negatively impact the presentation, operation and/or functionality of adjacent or related portions of the spreadsheet. Additionally, the disclosed system and method for dynamic spreadsheet reporting provides for recognizing when a new dimension member has been added to the associated database, and automatically adds the new dimension member to any report/display that contains an expansion formula calling for the dimension member, i.e., the dimension member is called for based on one of the dimension member's properties.

By using the method for dynamic spreadsheet reporting in saved reports, the need for active maintenance/updating of the report designs is significantly reduced because such saved reports are automatically expanded to include additional dimension members with the click of a button and new members are updated automatically from a "member list." As used herein, a "member list" is a hierarchical list of members that identifies parent/child relationships between the various members in an organization. Examples of the types of members that may be found in a members list include corporate entities, products, and departments within a corporation. As a more specific example, a member list may include "Sales" as a parent member in a member list, wherein "Sales US", "Sales Europe", and "Sales Asia" are dependent children members. As will be readily apparent to persons skilled in the art, the foregoing examples of members that may be included in a members list (and the parent/child relationships associated therewith) are merely illustrative, and alternative member lists (and parent/child relationships) may be employed, e.g., based on any desired categorization of data and/or information.

According to the present disclosure, exemplary functions for implementing the disclosed system and method for dynamic spreadsheet reporting are provided hereinbelow. However, these disclosed functions are merely illustrative of mechanisms for implementing the advantageous principles of the disclosed system/method. Alternative implementations may be implemented based on the principles disclosed herein, without departing from the spirit or scope of the presently disclosed invention.

An exemplary function that may be used in a spreadsheet program or application for implementing the disclosed system and method for dynamic spreadsheet reporting may have the following form: "EVEXP(parameters for executing the function)", wherein the "parameters for executing the function" may include parameters entitled Appname, Member, KeyRange, DataRange, ExpandDown, IncludeFlag, LevelDown, ParentBefore, Filter, and RepeatBlock. The EVEXP formula allows a user to: (i) specify whether to expand/vary the report by row or by column, (ii) define which member to base an expansion/variation on, and (iii) define expansion/variation parameters. According to a preferred embodiment of the present disclosure, use of two EVEXP functions in a report allows a user to expand/vary the report by both row and column. In an expansion/variation according to the present disclosure, only the member on which the expansion/variation is based must be specified. Any other members in the expansion/variation may be specified in a Filter, the use of which is described in more detail hereinbelow.

Referring to FIG. 1, an exemplary spreadsheet is provided wherein an EVEXP function for row expansion/variation is included in cell B4. More specifically, the function EVEXP ($B$1,$B$2,A10:A15, B10:G15,,"Evdep",,FALSE) is defined in cell B4, wherein the parameters are defined as follows:

$B$1=Appname, "Finance", the current application;
$B$2=Member, "Sales", the current member;
A10:A15=KeyRange;
B10:G15=DataRange;
,,=ExpandDown, the default for ExpandDown is TRUE (or blank as in this example);
"evdep"=IncludeFlag, evdep will return all the dependents of the current member;
,,=LevelDown, the default value for level down is 1 (or blank as in this example); and
FALSE=ParentBefore, FALSE puts the parent (in this example Sales) after the children.

The above EVEXP function displays the dependents (e.g., "SalesUS", "SalesEurope", "SalesAsia", "Esales (sales elimination), "SalesBrazil", and "SalesAdj") of the current entity member (i.e., "Sales").

The parameters for the EVEXP function, namely, Appname, Member, KeyRange, DataRange, ExpandDown, IncludeFlag, LevelDown, ParentBefore, Filter, and RepeatBlock, are more particularly defined as follows:

Appname=current application name.
Member=dimension member on which you would like to base your expansion/variation.
KeyRange=specifies a border for the expansion/variation which must be a minimum of two rows (if ExpandDown is True) or two columns (if ExpandDown is False).
DataRange=specifies a range of formulas to be copied. The first row of the DataRange is copied and used throughout the data range. DataRange must be a minimum of two rows (if ExpandDown is True) or two columns (if ExpandDown is False.)
ExpandDown=this parameter is optional according to an exemplary embodiment of the present disclosure. The default value=TRUE. TRUE=expand/vary members by row. FALSE=expand/vary members by column.
IncludeFlag=this parameter is also optional according to an exemplary embodiment of the present disclosure. The default value="SELF". IncludeFlag specifies what members to include in expansion/variation. (See IncludeFlag Flags hereinbelow for examples.)
LevelDown=this parameter is also optional according to an exemplary embodiment of the present disclosure. It is used with MDX flags (described below) to specify how many levels within a hierarchy to display.
ParentBefore=This parameter is also optional according to an exemplary embodiment of the present disclosure. If TRUE, ParentBefore puts parent before children. If FALSE, it puts parent after children;
Filter=this parameter is also optional according to an exemplary embodiment of the present disclosure. It is used to base expansion/variation on member properties and to specify fixed dimension members. Filter uses conditional MDX statements. (See Filter examples hereinbelow for more information.)
RepeatBlock=this parameter is also optional according to an exemplary embodiment of the present disclosure. RepeatBlock repeats a block of cells for each member. It works similar to DataRange (described hereinabove) except blocks of cells are copied.

The KeyRange and DataRange properties control the area within a report that is to be expanded/varied. These properties must generally have a value of at least two (i.e., either two rows or two columns) in order for an expansion/variation to work.

More particularly, the KeyRange specifies a beginning point and an end point for an expansion/variation. For example, in a report that totals departmental expenses, a user may have individual expense accounts in rows A13 through A20 and a summation account (e.g., TotalDepartmentalExpenses) in row A21. If the user wants to be able to use this report for any other accounts as well, then he/she will add the EVEXP function to a cell of the report. The parameter KeyRange in the EVEXP function will be specified as rows A13 through A20. Leaving row A21 out of the KeyRange will allow row A21 to always come after the accounts regardless of how many, or how few rows are added to or included in the report. In this way, once the appropriate accounts are retrieved, the disclosed system/method expands/contracts the appropriate discrete region of the spreadsheet to include the retrieved accounts, while maintaining the overall report structure, operation and functionality of the spreadsheet. In other words, the expansion/contraction of a discrete portion of the spreadsheet does not impair or negatively impact the presentation, operation and/or functionality of adjacent portions of the spreadsheet, e.g., the functionality of row A21.

The DataRange parameter specifies what area of the report to copy when the report is expanded/varied. This property maintains the report structure by copying the formulas and formatting of the first row of the range and copying these formulas and formatting to all the new rows after the expansion/variation.

As indicated above, the IncludeFlags parameter according to the present disclosure specifies what members to include in an expansion/variation. The following flags are available for use as IncludeFlags parameters:

| Flag | Result |
| --- | --- |
| "SELF" (Default) | |
| "EVDPS" | Returns the dependents of the current member and the current member |
| "EVDEP" | Returns the dependents of the current member |
| "EVBSS" | Returns the base level members for the current member and the current member |
| "EVBAS" | Returns the baseline members for the current member |
| "EVALS" | Returns the current member and all members below the current member |
| "EVALL" | Returns all members below the current member |
| "EVMembers" | Returns all members, above and below, current member |

Note: The result is based on the flag being used with any filter. Use of filters greatly enhances the efficacy of the IncludeFlags functionality.

The disclosed system and method for creating dynamic reports in a spreadsheet also advantageously supports the following MDX Flags:

| Flag | Result |
| --- | --- |
| "BEFORE" | Default. Returns descendant members from LevelDown value only. Includes <<Member>>, if and only if LevelDown value specified is the level of <<Member>>. |
| "AFTER" | Returns descendant members from all levels subordinate to LevelDown value. |
| "LEAVES" | Returns leaf descendant members irrespective of the level. |
| "SELF_AND_AFTER" | Returns descendant members from LevelDown value and all levels subordinate to LevelDown value. |
| "SELF_AND_BEFORE" | Returns descendant members from LevelDown value and all levels between <<Member>> and LevelDown value. |
| "SELF_BEFORE_AFTER" | Returns descendant members from all levels subordinate to the level of <<Member>>. |
| "BEFORE_AND_AFTER" | Returns descendant members from all levels subordinate to the level of <<Member>> except members from LevelDown value. |

The filter property is an optional property according to the present disclosure and is generally used in conjunction with the IncludeFlag property. The value in the IncludeFlag is "filtered" based on the value, or condition, in the Filter. Some examples of filters are as follows (the filter is underlined). Of course, alternative filters may be used, in whole or in part, as will be apparent to persons skilled in the art based on the disclosure herein.

The following filter returns members based on the current member's property.

EVEXP($B$1,$B$2,A17:A40,B17:
 H40,"Evmembers",,FALSE,
 $A$2&".currentmember.properties(""""&C2&"""")=
 """"&D2&"""")

wherein:
 $A$2=the dimension name;
 &C2&=the property name; and
 &D2&=the value for the property.

For example, "Account.Revenue&ACCTYPE=INC" would return all income accounts in the KeyRange. If a user changes the Account from Revenue to CostofGoodsSold, the ACCTYPE would change from INC (income) to EXP (expense), and all expense accounts would be displayed in the key range. It is important to note that cell C2 must contain the property name (i.e., ACCTYPE) and cell D2 must contain the property value of the member/property combination.

A method by which the system of the present disclosure executes the EVEXP function includes the step of defining a report sheet with cell based data retrievals based on parameters containing organizational components to define desired data. Thereafter, a preferred method according to the present disclosure defines a dynamic expansion as a function in a cell with parameters to define Key Range and Data Range sections of the sheet to expand/vary and query criteria to determine dynamic organizational components driving data retrievals from a database. A preferred method according to the present disclosure further entails that the sheet is then expanded by running an expansion macro which includes the steps of recalculating the sheet and building a cache in memory of each expansion function and its parameters. Thereafter, each defined expansion according to the disclosed method is performed by querying the database for a list of members based on selection parameters in the definition; inserting or deleting cells in the Key range and Data range as necessary to accommodate exactly the numbers of members in the member list; populating the Key range cells with items from the member list; and copying source data block to fill the entire Data range. According to preferred embodiments of the disclosed method, the memory cache is then deleted and the spreadsheet recalculated in order to retrieve appropriate data for the newly expanded report.

Figure 2:
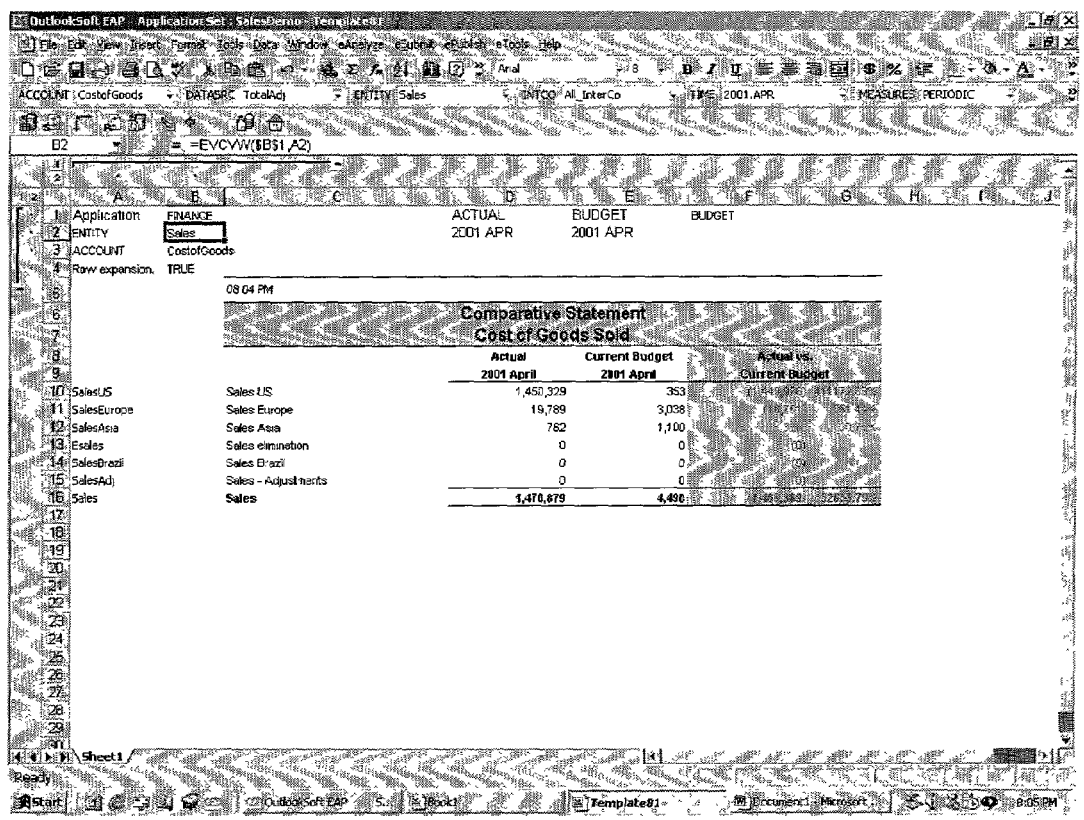
FIG. 2 is an exemplary screen display illustrating the use of an EVEXP formula for dynamically varying, e.g., expanding, the rows of a report or display.

Referring to FIG. 2, another example is provided, wherein a Cost of Goods report by department for Sales shows the company wide Sales regions of Sales US, Sales Europe, Sales Asia, Sales Elimination, Sales Brazil and Sales Adjustments, which make up total Sales. This same Cost of Goods report for Sales US will show the US Sales regions, e.g., Sales US East and Sales US West. For all other solutions prior to this invention, this required two different spreadsheet reports. Furthermore, prior to this invention, if the company organization changed, these reports would have to be manually edited to show the new organization. Utilizing the present invention, only one spreadsheet report is required and when the organization changes the report does not need to be manually edited.

Figure 3:
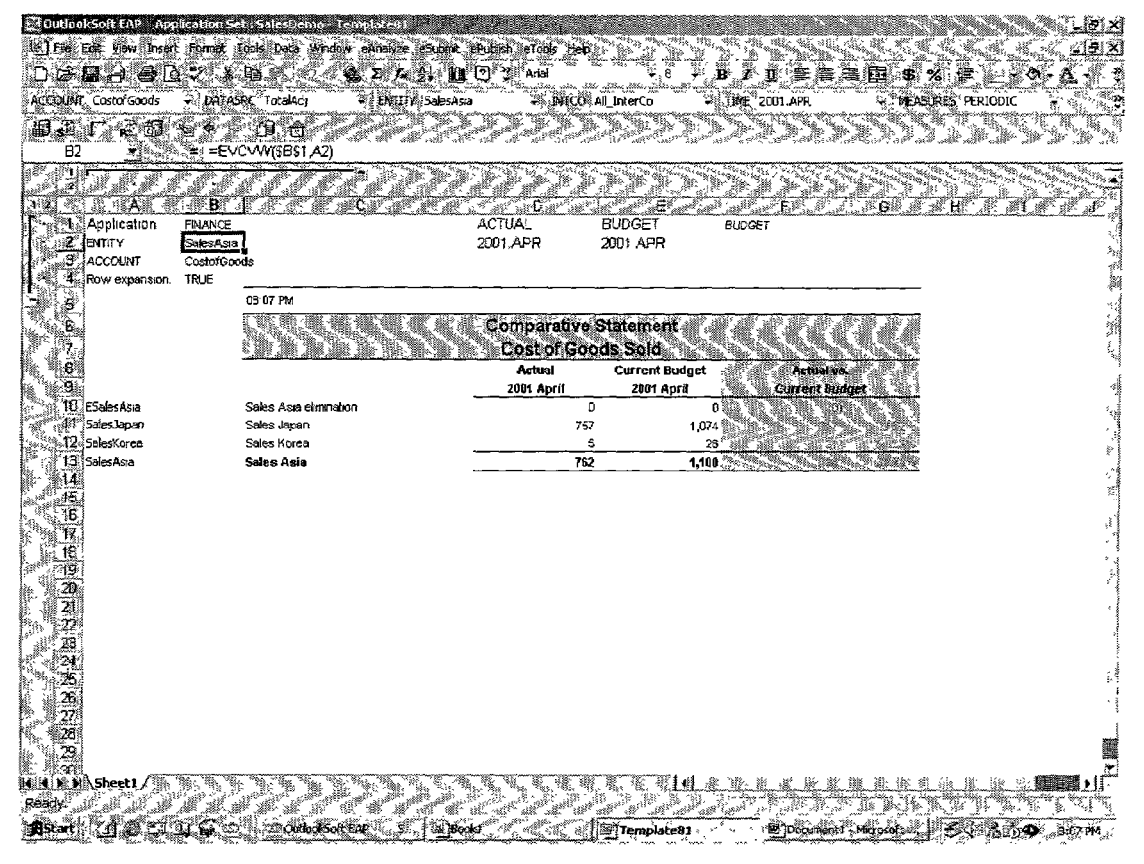

Referring to FIG. 3, the report dynamically shows the appropriate rows for any part of the company organization, while preserving the column and row formatting defined in the spreadsheet. The dynamic behavior is defined in this report with the following formula as defined in cell B4 as
EVEXP($B$1,$B$2,A10:A11,B10:
G11,"Evdep",FALSE).

It is notable that the difference between the reports illustrated in FIGS. 2 and 3 is that in the report in FIG. 2 the value in cell B2="Sales" and in the report in FIG. 3 the value in cell B2="SalesAsia". The report layout was automatically modified based on the change of this one piece of data.

Figure 4:
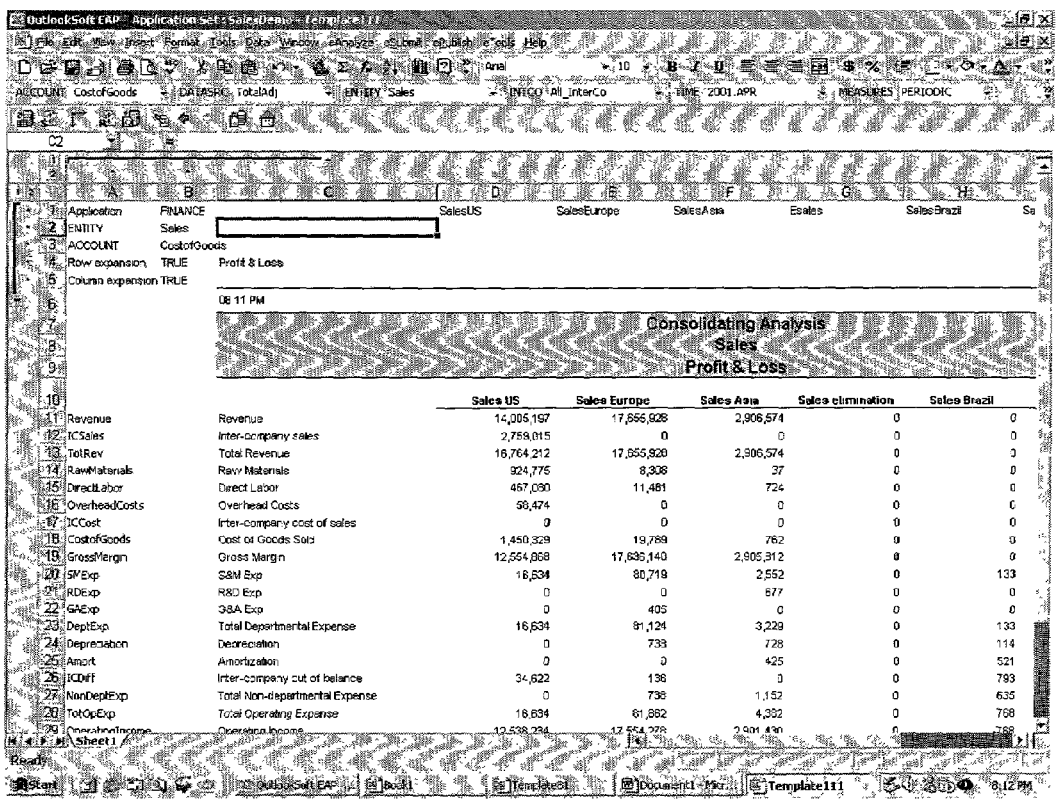
FIG. 4 is an exemplary screen display illustrating the use of EVEXP formulas for dynamically varying, e.g., expanding, the rows and columns of a report or display.

Multiple dynamic expansions are necessary for complete reporting capabilities in the spreadsheet. For example, referring to the report in FIG. 4, the columns and rows include dynamic expansions for expanding the columns and rows. More specifically, the rows expand based on a filter to show only accounts with a specified property value, while the columns expand based on the member hierarchy. The rows show all accounts with a Group value of "Profit & Loss" for a dynamic Income statement. The columns show the dependents of a member, so that it shows the company wide sales regions. The formula for expanding the rows for this report is
EVEXP($B$1,$B$2,A11:A33,B10:
J33,"EvMembers",FALSE,$A$2&". CurrentMember.Properties("""&$C$2&""")="""&$C$4&""")"),
wherein
Appname=Cell $B$1=Finance;
Member=Cell $B$2=Cost of Goods;
IncludeFlag="EvMembers" which means all members; and
Filter=Formula which evaluates to "ACCOUNT.CurrentMember.Properties("GROUP")="Profit & Loss" because the cell C4 contains the value "Profit & Loss"

Figure 5:
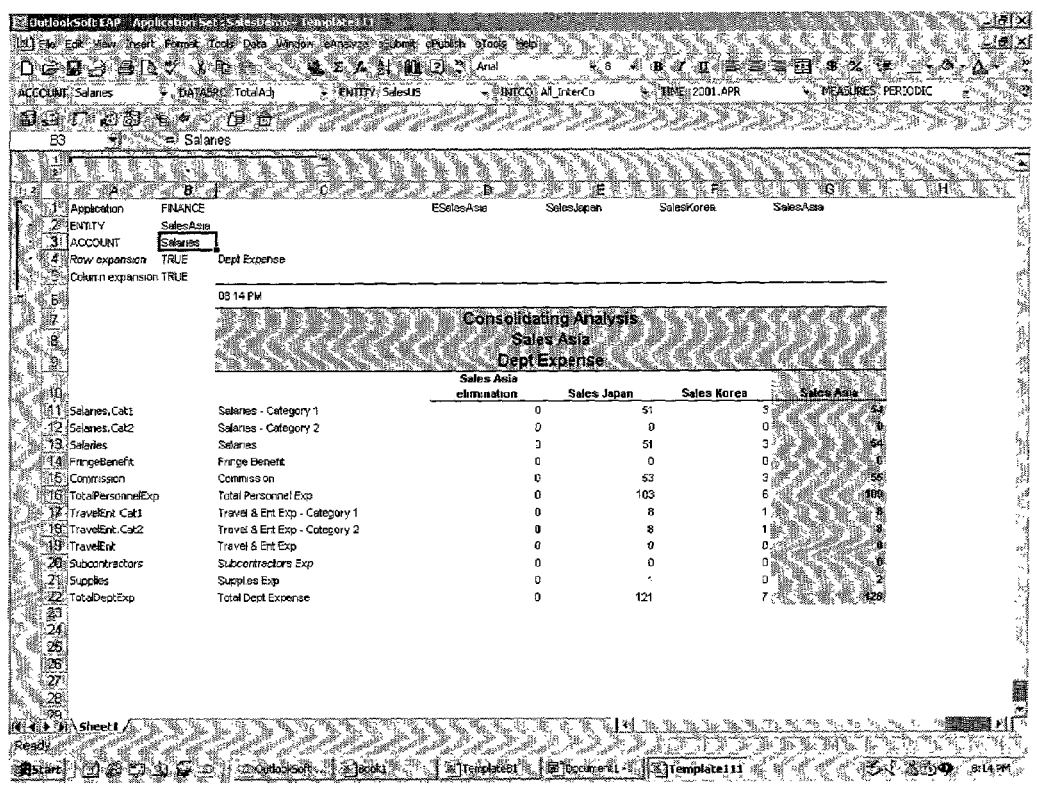
FIG. 5 is an exemplary screen display, similar to FIG. 4, illustrating the use of EVEXP formulas for dynamically varying, e.g., expanding, the rows and columns of a report or display.

The formula for expanding the columns for this report is
EVEXP($B$1,$B$2,D1:J1,D2:J33,FALSE,"Evdep",FALSE), wherein:
Appname=Cell $B$1=Application; and
Member=Cell $B$3="Sales".
Referring to FIG. 5, the rows show all accounts with a Group value of "Debt Expenses" for a dynamic Expenses statement. The columns show the dependents of a member, so that it shows the Asian sales regions (i.e., "Sales Japan" and "Sales Korea"). This new report was produced by changing the data in two cells. More particularly, cell C4 is changed to "Debt Expense", and cell B2 is changed to "SalesAsia". Conveniently, the user did not need to manually change the layout of the report to obtain the desired report. The formula for expanding the rows for this report is
EVEXP($B$1,$B$3,A11:A22,B11:
G22,"EvMembers",FALSE,
$A$2&".CurrentMember.Properties("""&$B$2&""")="""&$C$4&""")
wherein
Appname=Cell $B$1=Finance;
Member=Cell $B$3=Salaries;
IncludeFlag="EvMembers" which means all members; and
Filter=Formula which evaluates to
"ACCOUNT.CurrentMember.Properties("GROUP")="Debt Expense" because the cell C4 contains the value "Debt Expense".

A preferred formula for expanding the columns for this report is
EVEXP($B$1,$B$2,D1:G1,D2:G22,FALSE,"Evdep",FALSE), wherein
Appname=Cell $B$1=Finance; and
Member=Cell $B$2="SalesAsia".

Preferred systems and methods for creating dynamic reports according to the present disclosure provides and/or utilizes an additional function, namely EVNXP, for performing nested expansions/variations. Nested expansions/variations allow expansion/variation of one or more dimensions by the other dimensions. Generally, it is necessary to have a minimum of two expands in order to perform a nested expansion. An exemplary EVNXP function is defined as follows:
EVNXP(KeyRange,DataRange,Filter,RepeatBlock,expand1, . . . expand10)

wherein the KeyRange, DataRange, Filter and RepeatBlock parameters are all defined and utilized in the manner set forth hereinabove with respect to the EVEXP function. The remainder of the parameters, that is "expand1" through "expand10", represent the expansions in the report or input schedule. As noted hereinabove, a user is generally required to have a minimum of two expands in order to perform nested expansions.

An example of a nested expansion follows. In an exemplary report, time periods may be the determinative parameter for individual columns (e.g., January, February, March, etc.). With respect to the rows of such report, however, two distinct parameters may be reflected from row to row, e.g., the names of individual entities (Sales, RD, Manufacturing, etc.) and financial categories (Budget, Actual, Forecast, etc.). In this exemplary report, two row expansions are thus defined: one expansion for the "financial categories" (which returns all financial categories in the application) and a second expansion for the "names of individual entities" (which returns all dependants of the current view member). Described below with reference to FIGS. 6 and 7 is an example of what a report would look like with the exemplary nested expansions described hereinabove (with four dependants for the entities).

Figure 6:
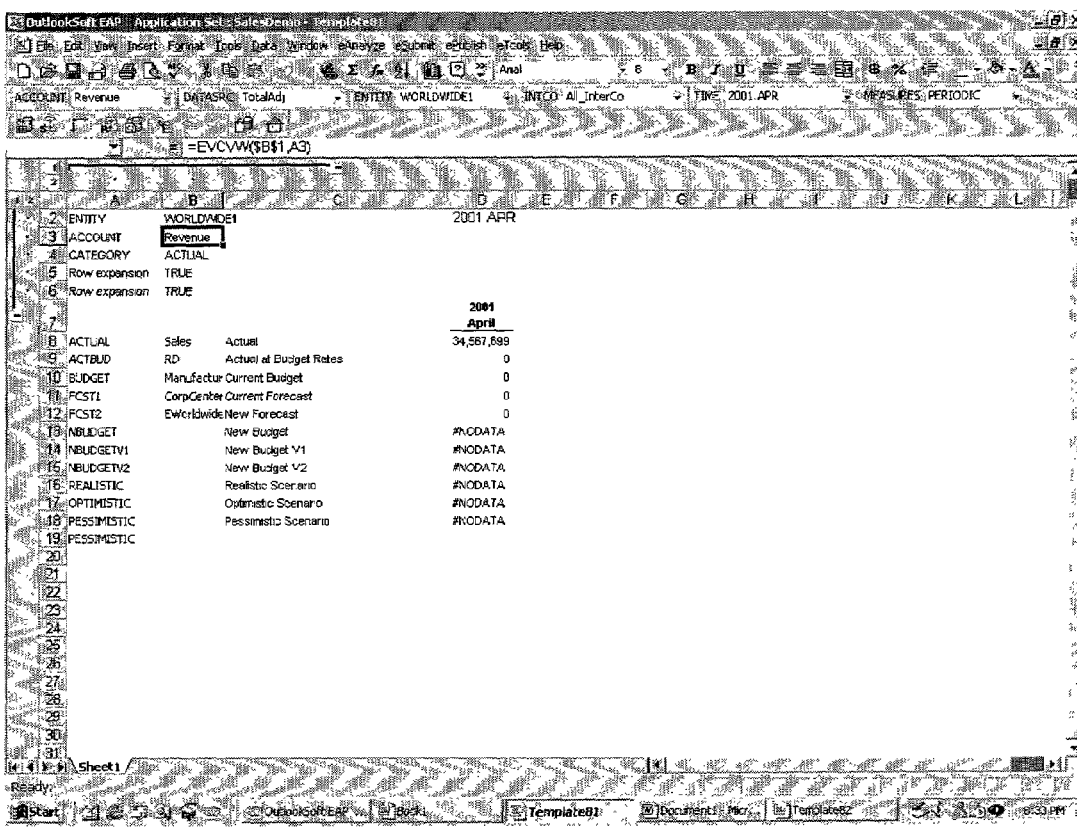
FIG. 6 is an exemplary screen display illustrating the use of an EVNXP formula for dynamically varying, e.g., expanding, the rows of a report or display for two members.
Figure 7:
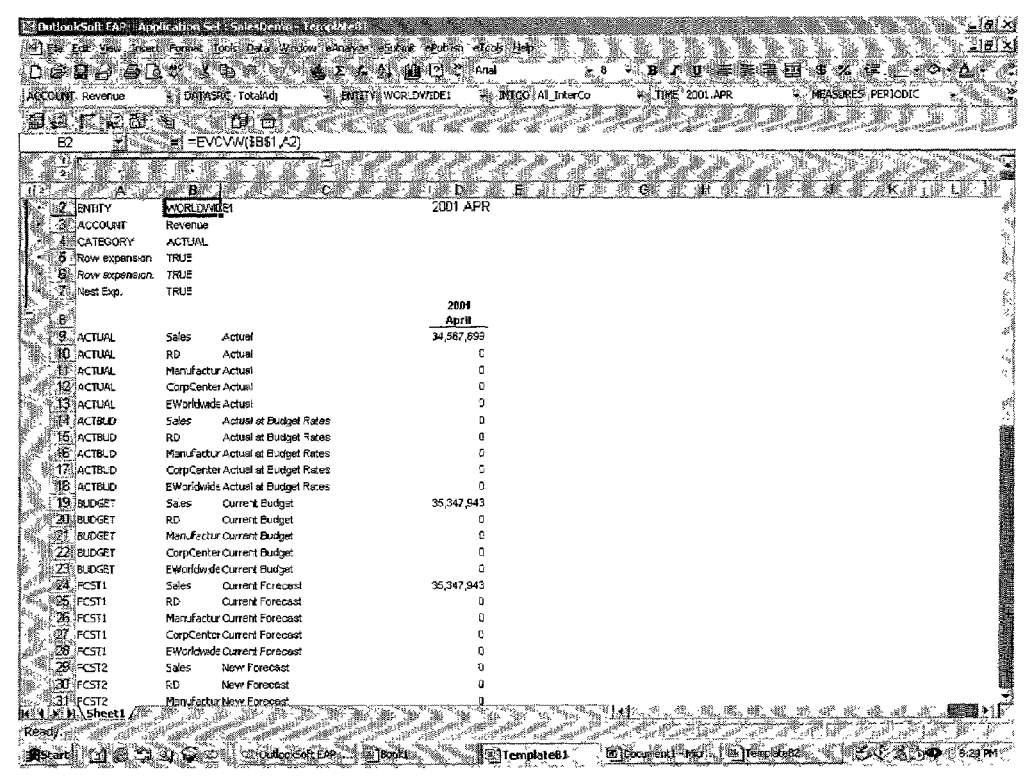

Thus, referring to FIG. 6, the expansion in row 5 for category returned all categories and the expansion in row 6 for entities returned five dependents. According to the disclosed system and method, a nested expansion may be added to the spreadsheet that will perform an expansion for each combination of the two original expansions. The outcome of such nested expansion is shown in FIG. 7, wherein the nested expansion expanded each category for each entity. In the disclosed example, only three categories and one entity match up, leaving the remaining entities/categories with no value. With nested expansion added to the report, the disclosed system and method provides the desired result, which is a cross-join with each category and each entity, with only two expands.

An EvENE function is provided according to the present disclosure which is an enhanced version of the EvEXP function. The EvENE function allows users of the disclosed system and method more flexibility in building expansion formulas and supports advantageous sorting and ranking functions. Generally, the EvEXP function does not support such sorting/ranking functionalities. The EvENE function generally takes has the following syntax:

EvENE("AppName", KeyRange, DataRange, SetExpression, ExpandDown, RepeatBlock)

wherein the function and operation of the AppName, KeyRange, DataRange, ExpandDown and RepeatBlock parameters are as explained in the EvEXP discussion set forth hereinabove. Of note, the SetExpression provides the same functionality as the filter in an EvEXP function. More particularly, the SetExpression parameter identifies what members to return and in what fashion to return them for purposes of the disclosed system and method. The set expression is generally an EvSET formula or an MDX expression. The KeyRange contains the same number of rows (or columns) as the number of dimensions in the SetExpression.

An exemplary EvENE formula is as follows:

=EVENE("MAIN",A31:A60,B31:G60,EVSET("WorldWide1","SELF _AND_BEFORE",99,TRUE,EVPXR("ENTITY","CURRENCY") & "=""USD"""))

Where:
Main=the application
A31:A60=the KeyRange
B31:G60=the DataRange
EVSET("WorldWide1","SELF_AND_BEFORE",99, TRUE,EVPXR
("ENTITY","CURRENCY") & "=""USD""")=the SetExpression Of note, the SetExpression contains two "ev" functions, namely an EvSET and an EvPXR (described hereinbelow) function. These "ev" functions can be nested within EvENE and EvLST functions to facilitate expansion formula creation according to the present disclosure. In the example above, the EvSET and EvPXR formulas are contained within the EvENE formula. The functions may also be broken into separate cells and referenced in an EvENE formula, i.e., by reference to the cell(s) containing such functions. In this way, maintenance of the "pieces" of the formula may be more easily and efficiently achieved.

A further functionality that may be utilized according to the present disclosure is the EvLST functionality, which returns a list of members into a specified range of cells. The syntax for the EvLST generally takes the following form:

EvLST("AppName",DimensionName,SetExpression, Target, PropertyName, ExpandDown, RepeatDuplicates)

Where:
AppName is the name of the application
DimensionName is the name of the dimension upon which the list is based
SetExpression is the string that identifies the members to return for purposes of the EvLST function.
Target is the range of cells where the returned results are written.
PropertyName is the name of the property for which the values are listed. The default value is generally "Name". According to preferred embodiments of the present disclosure, the PropertyName parameter is optional.
ExpandDown defines whether the list will be expanded down the rows (TRUE) or across the columns (FALSE). According to preferred embodiments of the present disclosure, the default value is "TRUE". The ExpandDown is generally an optional parameter according to the present disclosure; if the ExandDown parameter is not defined, the disclosed system/method generally defaults to an expansion down the rows.
RepeatDuplicates defines how duplicate values are treated. When set to TRUE (the default), duplicates are displayed. When set to FALSE, duplicate values are suppressed.

An exemplary EvLST function is set forth, wherein the currency for the WorldWide1 and its children will be returned according to the system and method of the present disclosure:

=EVLST("Main","Entity",EVSET(WorldWide1, "SELF_AND_BEFORE", 99,TRUE,),J21:J28,"Currency", TRUE,FALSE)

A further function according to preferred embodiments of the present disclosure is the EvSET function, which creates a set expression to be used in an EvENE or EvLST function. On its own, an EvSET function has no impact on the behavior and/or attributes of a report. The only impact of an EvSET function is reflected in its influences on the operations of an EvENE or EvLST function. An EvSET function is generally utilized to create a set expression, which is then used in the SetExpression parameter of the EvENE or EvLST function. The disclosed EvSET function generally follows the following syntax:

EvSET("AppName","Member", IncludeFlag, LevelDown, ParentBefore, Filter)

An exemplary EvSET formula is set forth hereinbelow:

EVSET("Main","WorldWide1","SELF_AND_BEFORE",99,TRUE, "ENTITY.CURRENTMEMBER.PROPERTIES(""Currency"")=""USD""")

This EvSET formula will return WorldWide1 and all descendents whose Currency property value is USD.

A further function provided according to the present disclosure is the EvPXR function, which generally has the following syntax:

EvPXR("DimensionName","PropertyName","MemberName")

The EvPXR function generally returns an MDX property expression that can be used in place of the filter parameter in an expansion formula. The expression returned by an EvPXR function is generally in the form:

DimensionName.MemberName.Properties("PropertyName").

An exemplary EvPXR function according to the present disclosure is set forth as follows:

EvPXR(ACCOUNT.CurrentMember.Properties("ACCTYPE")

The EvPXR function can generally be used in place of a filter expression in EvEXP, EvNXP, EvENE, EvSET and/or EvLST functions.

Thus, the present disclosure provides a system and method for supporting and enabling the creation of dynamic reports and data presentations in connection with a spreadsheet application or program that offers spreadsheet-based formatting and calculation capabilities. The system and method of the present disclosure may be used in conjunction with or incorporated as part of spreadsheet programs found on stand-alone clients and/or networked clients. Preferred embodiments of the present disclosure are advantageously incorporated into a web-based, collaborative spreadsheet-based solution, such as the EAP™ product that is commercially available from the assignee of the present application.

Turning to exemplary hardware/network systems for implementations of the disclosed method and system that are not restricted to stand-alone computer systems, an exemplary networked system includes at least one server and at least one client that communicate across a computer network, e.g., an intranet, the Internet and/or the World Wide Web. As will be readily apparent to persons skilled in the art, a plurality of clients may be provided, each of which is adapted to communicate with the server via the network, whether sequentially or simultaneously, provided appropriate security clearance is achieved.

It is contemplated according to the present disclosure that clients may access and communicate with the network through any data communication technology. For example, a client may comprise one or more personal computers that are part of a conventional local area network (LAN) that is wired directly to the Internet through a conventional port, e.g., a T-connection. The client may also constitute one or more personal computers that use a modem to connect via a phone or cable connection to a network. The personal computers may also be part of a peer-to-peer network. In any case, the client(s) are adapted to communicate with the network such that information may be transmitted to and from the server, e.g., through one or more routers, wide area networks (WANs), satellites, hubs, repeaters, bridges and gateways, as is known in the art. Data transmissions are typically passed from network to network in packets that include not only the substantive aspects of the data transmission, but addresses, error checking information and the like.

The client typically includes at least two software applications for purposes of preferred methods and systems according to the present disclosure: a spreadsheet software program and a Web browser software application. The spreadsheet program and browser are loaded into the memory of the client or otherwise available for utilization by the client, e.g., from an ancillary floppy, CD-ROM, DVD and/or tape drive. Any conventional browser is contemplated for use according to the method/system of the present disclosure, e.g., Netscape Communicator or Microsoft Internet Explorer. Similarly, the method/system of the present disclosure may be utilized with any spreadsheet program, e.g., Lotus 1-2-3, Quattro Pro, Excel and/or legacy spreadsheet systems. A preferred spreadsheet program for use by a client according to the present disclosure is Microsoft Excel 2000. Preferred browser programs for use by a client according to the present disclosure are Microsoft Internet Explorer 4.0 (or later) and Netscape Communicator V4.0 (or later).

Beyond a spreadsheet program and a browser, the client may typically contain and/or have direct access to a variety of ancillary user documents, whether stored within its memory and/or accessible from an associated drive or server. For example, the client may have access to user documents that include word processing documents, audio and/or graphical files, spreadsheets and the like. The client is generally adapted to work "off-line," i.e., independent of network, or "on-line," i.e., in communicative interaction with the network and server. When working off-line, the client will not have access to data stored in any database(s) associated with the server, nor will the client be able to feed data to such ancillary database(s). Nonetheless, data from such ancillary database(s) may be pre-downloaded to the client when on-line and, to the extent data is input, modeled and/or modified at the client by a user working off-line, such input/modified data may be stored in the memory of the client and subsequently transmitted/uploaded to the server via the network thereafter. In a preferred embodiment of the present disclosure, the client includes an operating system selected from Microsoft Windows or Microsoft NT Workstation.

The server generally facilitates client communication and data exchange with database(s) associated with the server. In certain exemplary embodiments of the present disclosure, the server preferably facilitates access to enterprise systems and/or sources, e.g., an enterprise's ERP system, general ledger and other systems. In exemplary system embodiments, the server utilizes the Windows NT 4.0 operating system and, based on the approximate number of users, is configured as follows:

| Number of Users | Number of Servers | Exemplary Components |
|---|---|---|
| Up to 50 | 1 server | Web/File/SQL/OLAP |
| 50 to 250 | 2 servers | Web/File SQL/OLAP |
| 250 to 500 | 3 servers | Web    or    Web<br>File           File/SQL<br>SQL/OLAP    OLAP |
| 500 to 1000 | 4 servers | Web 1    or    Web<br>Web 2         File<br>File           SQL<br>SQL/OLAP    OLAP |
| 1000 and beyond | 5+ servers | 2 or more Web<br>File<br>SQL<br>OLAP |

To maximize speed and performance characteristics, the server(s) are generally uniformly configured, while permitting customization that best meets individual user's system requirements. Typical server configurations according to the present disclosure are set forth below:

| Component | Low End | High End |
|---|---|---|
| Pentium III/500 CPU | Dual | Quad |
| RAM | 256 MB | 2 GB |
| Hard Drive(s) | 9 GB Raid 5 | 20 GB Raid 5 |

In preferred embodiments of the present disclosure, the disclosed system provides security across all physical and logical components, thereby ensuring high level data and application integrity. Functional security is generally provided by allowing system administrator(s) to restrict user access to features, functionality, documents and data, down to individual dimensions or fields within the spreadsheet program. In addition, connections security is generally achieved according to the present disclosure by providing data encryption of all information exchanged via the Internet and/or World Wide Web by utilizing SSL connections through https protocol and encryption keys.

While the present disclosure includes a description of the system and method with reference to various specific embodiments, those skilled in the art will readily appreciate that various modifications, changes and enhancements may be made thereto without departing from the spirit or scope of the invention as defined by the appended claims.

What is claimed is:

1. A method for dynamic spreadsheet reporting, comprising:
   a) providing an electronic spreadsheet having a plurality of cells that are arrayed in a defined number of columns and rows;
   b) providing a database in communication with said electronic spreadsheet;
   c) receiving an expansion formula in at least one of said plurality of cells that comprises at least one dimension member and instructions for expansion, said expansion formula functioning to control retrieval of data associated with said at least one dimension member;
   d) in response to rendering said electronic spreadsheet, using said at least one dimension member from said expansion formula to query said database to retrieve data associated with said at least one dimension member from said database;
   e) storing said retrieved data associated with said at least one dimension member from said expansion formula in a cache for use to respond to one or more queries to said database for said at least one dimension member;
   f) using said instructions for expansion from said expansion formula to automatically adjust at least one of the defined number of said columns and rows to accommodate said data responsive to said querying of said database; and
   g) populating said adjusted columns and rows with said retrieved data while maintaining the operation and functionality of said electronic spreadsheet.

2. A method according to claim 1, wherein said electronic spreadsheet is supported by a spreadsheet application that provides formatting and calculation functionalities to said electronic spreadsheet.

3. A method according to claim 2, wherein said spreadsheet application operatively resides on a computer system selected from the group consisting of a stand-alone client and a networked client.

4. A method according to claim 2, wherein said spreadsheet application is a collaborative spreadsheet application that operates across a plurality of networked computers.

5. A method according to claim 1, wherein said data includes at least one dimension member, and wherein said at least one dimension member is identified by at least one parameter set forth in said expansion formula.

6. A method according to claim 5, wherein said at least one dimension member is a data category.

7. A method according to claim 6, wherein said data category is selected from the group consisting of time periods, departments, account types, account categories, product types, product categories and combinations thereof.

8. A method according to claim 5, further comprising:
   d) automatically updating said electronic spreadsheet to include a new dimension member upon introduction of said new dimension member to said database, provided the definition of said expansion formula calls for retrieval of said new dimension member from said database.

9. A method according to claim 1, wherein in automatically varying at least one of the defined number of said columns and rows, said expansion formula does not impair operability or functionality of said electronic spreadsheet external to said data retrieval accommodation.

10. A method according to claim 1, further comprising defining a member list in said database, said member list including hierarchical list of members within a given category of said data.

11. A method according to claim 1, wherein said expansion formula utilizes at least one function selected from the group consisting of an EVNXP function, an EVNXP function, an EvENE function, an EvLST function, an EvSET function, an EvPXR, and combinations thereof.

12. A method according to claim 11, wherein said expansion formula utilizes at least two nested functions.

13. A method according to claim 1, further comprising:
   d) recalculating said electronic spreadsheet based on data retrieval from said database controlled by said expansion formula, and
   e) building a cache in a memory for said expansion formula.

14. A method according to claim 13, further comprising:
   f) expanding said electronic spreadsheet by querying said database for a list of members as defined in expansion parameters included in said expansion formula;
   g) adjusting the number of cells in a key range and a data range associated with said expansion formula as necessary to accommodate said list of members;
   h) populating said key range with members from said list of members, and
   i) copying formulas from at least one of said plurality of cells to an appropriate newly inserted cell to fill an entire data range.

15. A method according to claim 14, further comprising:
   j) deleting said cache in said memory; and
   k) recalculating said electronic spreadsheet in said expanded electronic spreadsheet.

16. A system for supporting dynamic spreadsheet reporting, comprising:
   a client that includes a processor and associated data storage containing at least one database, said processor adapted to process programmatic instructions associated with an electronic spreadsheet having a plurality of cells that are arrayed in a defined number of columns and rows; said programmatic instructions directing said processor to:
   receive at least one expansion formula inserted into in at least one of said plurality of cells that comprises at least one dimension member and instructions for expansion, said expansion formula functioning to control retrieval of data associated with the at least one dimension member;
   in response to rendering said electronic spreadsheet, use said at least one dimension member from said expansion formula to query said database to retrieve data associated with said at least one dimension member from said database;
   store said retrieved data associated with said at least one dimension member from said expansion formula for use to respond to one or more queries to said database for said at least one dimension member;

use said instructions for expansion from said expansion formula to automatically adjust at least one of the defined number of said columns and rows to accommodate said data responsive to said querying of said database; and populate said adjusted columns and rows with said retrieved data while maintaining the operation and functionality of said electronic spreadsheet.

17. A system according to claim 16, wherein said programmatic instructions provides formatting and calculation functionalities to said electronic spreadsheet.

18. A system according to claim 16, wherein said client communicates with a server across a network, and wherein said data storage is associated with said server.

19. A system according to claim 16, wherein said spreadsheet application is a collaborative spreadsheet application that operates across a plurality of networked computers.

20. A system according to claim 16, wherein said data includes at least one dimension member, and wherein said at least one dimension member is identified by at least one parameter set forth in said expansion formula.

21. A system according to claim 16, wherein said programmatic instructions affect automatic updating of said electronic spreadsheet to include a new dimension member upon introduction of said new dimension member to said database, provided the definition of said expansion formula calls for retrieval of said new dimension member from said database.

22. A system according to claim 16, wherein in automatically varying at least one of the defined number of said columns and rows, processing of said expansion formula by said processor does not impair operability or functionality of said electronic spreadsheet external to said data retrieval accommodation.

23. A system according to claim 16, wherein in processing said expansion formula, said processor processes at least one function selected from the group consisting of an EVEXP function, EVNXP function, an EvENE function, an EvLST function, an EvSET function, an EvPXR function, and combinations thereof.

24. A system according to claim 16, wherein in processing said expansion formula, said processor processes at least two nested functions.

* * * * *